United States Patent
Yu et al.

(10) Patent No.: US 11,942,534 B2
(45) Date of Patent: Mar. 26, 2024

(54) BIPOLAR TRANSISTOR WITH THERMAL CONDUCTOR

(71) Applicant: GLOBALFOUNDRIES U.S. Inc., Malta, NY (US)

(72) Inventors: Hong Yu, Clifton Park, NY (US); Judson R. Holt, Ballston Lake, NY (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/745,178

(22) Filed: May 16, 2022

(65) Prior Publication Data
US 2023/0290868 A1    Sep. 14, 2023

Related U.S. Application Data

(60) Provisional application No. 63/317,749, filed on Mar. 8, 2022.

(51) Int. Cl.
*H01L 29/737* (2006.01)
*H01L 23/373* (2006.01)
*H01L 29/66* (2006.01)

(52) U.S. Cl.
CPC ........ *H01L 29/737* (2013.01); *H01L 23/3738* (2013.01); *H01L 29/66242* (2013.01)

(58) Field of Classification Search
CPC ........... H01L 29/66242; H01L 29/6625; H01L 29/735; H01L 29/737; H01L 29/7371; H01L 23/3738
See application file for complete search history.

(56) References Cited

U.S. PATENT DOCUMENTS

| | | | |
|---|---|---|---|
| 6,949,764 B2 | 9/2005 | Ning | |
| 7,528,012 B1 | 5/2009 | Hopper et al. | |
| 8,288,758 B2 | 10/2012 | Ning et al. | |
| 8,420,493 B2 | 4/2013 | Ning et al. | |
| 8,586,441 B1 | 11/2013 | Cai et al. | |
| 8,860,092 B1 * | 10/2014 | Li | H01L 29/401 257/E29.034 |
| 9,502,504 B2 | 11/2016 | Cai et al. | |
| 9,530,711 B2 | 12/2016 | Botula et al. | |
| 10,319,830 B2 | 6/2019 | Yang et al. | |
| 10,825,921 B2 | 11/2020 | Balakrishnan et al. | |
| 2003/0057523 A1 | 3/2003 | Oue et al. | |
| 2003/0189231 A1 | 10/2003 | Clevenger et al. | |

(Continued)

OTHER PUBLICATIONS

Field et al., "Thermal characterization of direct wafer bonded Si-on-SiC", Applied Physics Letters, Mar. 16, 2022, 8 pages.

(Continued)

*Primary Examiner* — Syed I Gheyas
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to a bipolar transistor with thermal conductor and methods of manufacture. The structure includes: a base formed within a semiconductor substrate; a thermal conductive material under the base and extending to an underlying semiconductor material; an emitter on a first side of the base; and a collector on a second side of the base.

16 Claims, 5 Drawing Sheets

(56) References Cited

U.S. PATENT DOCUMENTS

| | | |
|---|---|---|
| 2012/0139009 A1* | 6/2012 | Ning .................. H01L 29/7317 |
| | | 257/E29.187 |
| 2013/0112997 A1 | 5/2013 | Kawamoto et al. |
| 2014/0054604 A1 | 2/2014 | Ritenour |
| 2015/0084128 A1 | 2/2015 | Gambino et al. |
| 2016/0308010 A1 | 10/2016 | Viswanathan et al. |
| 2019/0273028 A1 | 9/2019 | Jain et al. |

OTHER PUBLICATIONS

Thibeault et al., "A study of ultra-high performance SiGe HBT devices on SOI", 2013 IEEE Bipolar/BiCMOS Circuits and Technology Meeting (BCTM), Abstract, 2 pages.

Yang et al., "High-performance nMOSFET with in-situ Phosphorus-doped embedded Si:C (ISPD eSi:C) source-drain stressor", IEEE, 2008, 4 pages.

Chu et al., "Strain: A Solution for Higher Carrier Mobility in Nanoscale MOSFETs", Annual Review of Materials Research, vol. 39, Aug. 4, 2009, Abstract, 2 pages.

Jain et al., "Study of mutual and self-thermal resistance in 90nm SiGe HBTs", 2013 IEEE Bipolar/BiCMOS Circuits and Technology Meeting (BCTM), Abstract, 2 pages.

Jayamon et al., "Multigate-Cell Stacked FET Design for Millimeter-Wave CMOS Power Amplifiers," IEEE Journal of Solid-State Circuits, vol. 51, No. 9, Sep. 2016, 2027-2039.

Search Report in related EP Application No. 22201123.1-1212 dated Jul. 31, 2023, 12 pages.

\* cited by examiner

BIPOLAR TRANSISTOR WITH THERMAL CONDUCTOR

BACKGROUND

The present disclosure relates to semiconductor structures and, more particularly, to a bipolar transistor with a thermal conductor and methods of manufacture.

Bipolar transistors can be vertical transistors or lateral transistors. Vertical bipolar transistors can be used for many different types of applications, e.g., ranging from high performance applications to low performance applications. For example, bipolar transistors can be used in mm-wave power amplifiers and low noise amplifiers, automotive radars and optical interconnects.

SUMMARY

In an aspect of the disclosure, a structure comprises: a base formed within a semiconductor substrate; a thermal conductive material under the base and extending to an underlying semiconductor material; an emitter on a first side of the base; and a collector on a second side of the base.

In an aspect of the disclosure, a structure comprises: a base formed over a semiconductor on insulator substrate; a buried insulator layer below the semiconductor on insulator substrate; a handle substrate below the insulator layer; a via comprising a thermal conductive material extending through the insulator layer and contacting the semiconductor on insulator substrate; an emitter laterally separated from the extrinsic base on a first side; and a collector laterally separated from the extrinsic base on a second side.

In an aspect of the disclosure, a method comprises: forming a base within a semiconductor substrate; forming a thermal conductive material under the base and extending to an underlying semiconductor material; forming an emitter on a first side of the base; and forming a collector on a second side of the base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor with a thermal conductor and methods of manufacture. More specifically, the present disclosure relates to a lateral SiGe heterojunction bipolar transistor with a thermal conductor underneath and thermally connected to a base region. In embodiments, the thermal conductor may be a semiconductor material with a higher thermal conductivity than the base substrate. For example, the thermal conductor may be SiC material underneath the base of the bipolar transistor. Advantageously, the thermal conductor improves thermal dissipation of the bipolar transistor, while improving stress and enhancing electron mobility for improved Ft/Fmax.

In more specific embodiments, the bipolar transistor is a lateral SiGe heterojunction bipolar transistor. The lateral SiGe heterojunction bipolar transistor comprises a SiGe base grown from a Si layer or grow directly on a SiGe marker layer. A SiC via may be formed in a buried insulator layer and connected with the device and an underlying SiC substrate layer. A SiC substrate layer may be formed on a handle substrate. The SiC via and SiC substrate layer may be a thermal conductor.

The bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistor of the present disclosure have been adopted from integrated circuit (IC) technology. For example, the structures are built on wafers and are realized in films of material patterned by photolithographic processes on the top of a wafer. In particular, the fabrication of the bipolar transistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
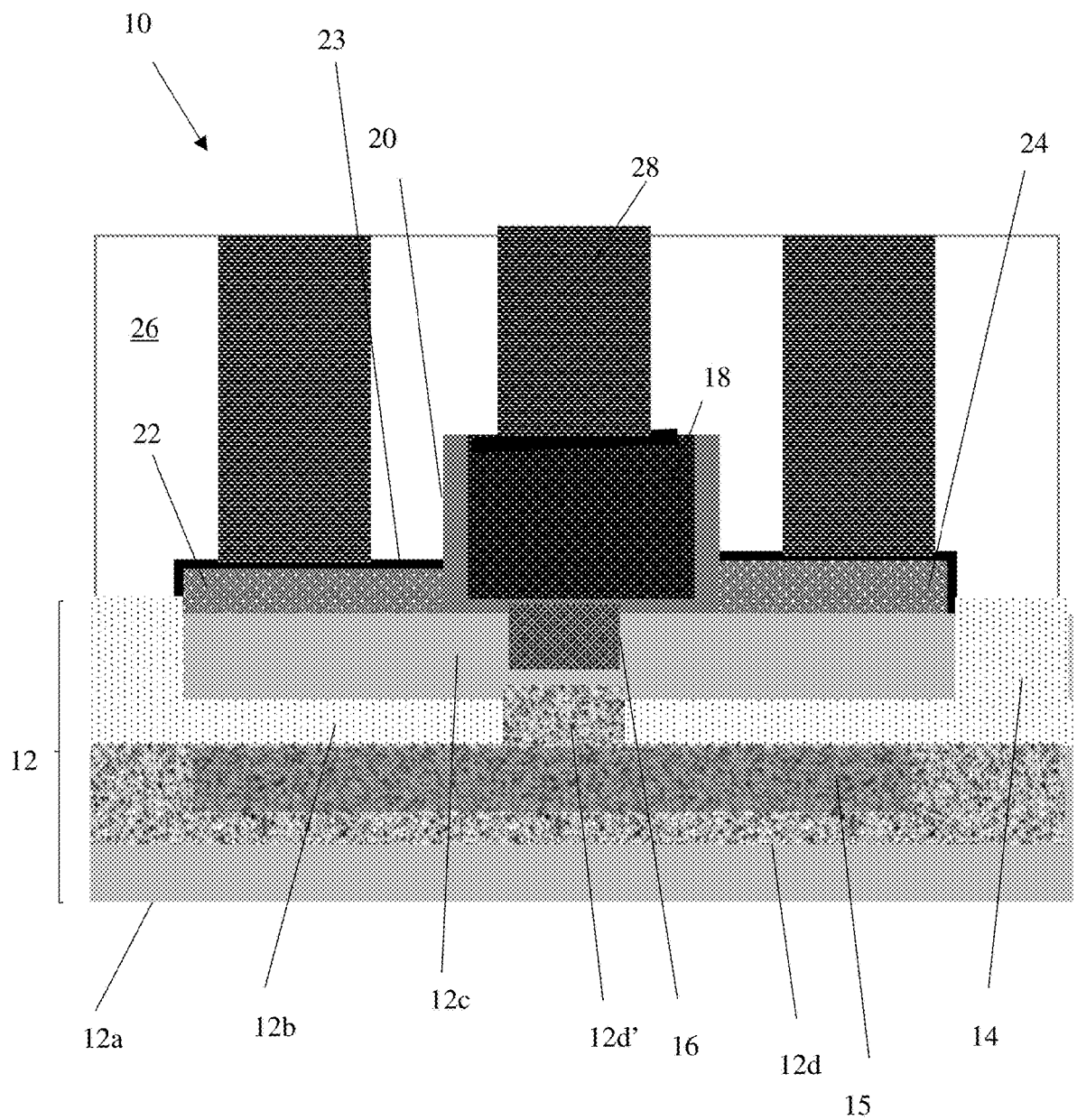
FIG. 1 shows a lateral heterojunction bipolar transistor in accordance with aspects of the present disclosure.

FIG. 1 shows a lateral heterojunction bipolar transistor in accordance with aspects of the present disclosure. More specifically, the structure 10 shown in FIG. 1 includes a substrate 12. In embodiments, the substrate 12 includes a handle substrate 12a, a buried insulator layer 12b, a semiconductor layer 12c and a thermal conductive material 12d. The handle substrate 12a provides mechanical support to the buried insulator layer 12b and the top semiconductor layer 12c.

In embodiments, the handle substrate 12a and the semiconductor layer 12c may include any appropriate semiconductor material such as, for example, Si, Ge, SiGe, SiC, SiGeC, a III-V compound semiconductor, II-VI compound semiconductor or any combinations thereof. In preferred embodiments, the semiconductor layer 12c may be a buffer layer comprising Si or SiGe and the handle substrate 12a may comprise Si. The semiconductor layer 12c may also be N+ semiconductor material. The handle substrate 12a and the semiconductor layer 12c may also comprise any suitable crystallographic orientation (e.g., a (100), (110), (111), or (001) crystallographic orientation). The buried insulator layer 12b may be a dielectric material such as silicon dioxide, silicon nitride, silicon oxynitride, boron nitride or a combination thereof, and preferably may be buried oxide layer (BOX).

The thermal conductive material 12d may be below the buried insulator layer 12b and include a via portion 12d' that extends through the buried insulator layer 12b to contact the device, itself. For example, the thermal conductive material 12d and, more particularly, the via portion 12d' extends to and contacts the semiconductor layer 12c. The thermal conductive material 12d may be a non-doped semiconductor material or P+ doped semiconductor material, either of which comprises a higher thermal conductivity than the semiconductor layer 12c. For example, in embodiments, the semiconductor layer 12c may be Si and the thermal conductive material 12d, 12d' may be SiC. As another example, the semiconductor layer 12c may be GaAs or GaN and the thermal conductive material 12d, 12d' may be Si or SiC. An N+ well 15 may be formed in the thermal conductive material 12*d* below the buried insulator layer 12*b* to provide electrical isolation between the via portion 12*d'* and the handle substrate 12*a*.

Shallow trench isolation structures 14 may be provided in the semiconductor layer 12*c* and extend to the buried insulator layer 12*b*. The shallow trench isolation structures 14 effectively isolate the lateral bipolar junction transistor 10 from other devices. As described herein, the shallow trench isolation structures 14 may be fabricated using conventional lithography, etching and deposition methods.

A base 16 (e.g., intrinsic base) may be formed within and above the semiconductor layer 12*c*. In embodiments, the base 16 may be above the via portion 12*d'*. In this way, the via portion 12*d'* may be connected to the base 16, e.g., heterojunction bipolar transistor, via the semiconductor layer 12*c*. As such, the via portion 12*d'* (and thermal conductive material 12*d*) may provide a thermal conductive pathway between the heterojunction bipolar transistor (e.g., base and/or collector and emitter) and the semiconductor substrate 12*a* (e.g., though the insulator layer 12*b*). The base 16 may be SiGe material, which is epitaxially grown on the semiconductor layer 12*c* followed by patterning processes, e.g., lithography and etching processes as described in more detail with respect to FIG. 2E. Also, the N+ well 15 is below (underneath) the base 16.

An extrinsic base 18 may be formed on the base 16. In embodiments, the extrinsic base 18 may be P+ semiconductor material, e.g., Si, polysilicon or SiC. A spacer 20 may be provided on sidewalls and extend partially underneath the extrinsic base 18. In embodiments, the spacer 20 separates (e.g., isolates) the extrinsic base 18 from a collector 24 and emitter 22, and more specifically separates contacts 28 on the extrinsic base 18 from the collector 24 and emitter 22. The spacer 20 may be a SiN, for example.

Still referring to FIG. 1, the emitter 22 may be formed on a first side of the extrinsic base 18 (and intrinsic base 16) and the collector 24 may be formed on a second side of the base 18. Accordingly, the emitter 22, collector 24 and base 18 may be laterally positioned in a horizontal plane forming a lateral bipolar transistor. Both the collector 24 and the emitter 22 may comprise raised epitaxial semiconductor material on opposing sides of the base 18. In more specific embodiments, the collector 24 and the emitter 22 may be N+Si material. The collector 24 and the emitter 22 may be formed over and in direct contact with the semiconductor layer 12*c* (or optional SiGe marker layer also shown at reference numeral 12*c*).

FIG. 1 further shows a silicide 23 on the emitter 22, extrinsic base 18 and collector 24. As described in more detail herein at FIG. 2F, the silicide 23 may be formed using conventional silicide processes. A plurality of contacts 28 within dielectric material 26 may contact the emitter 22, extrinsic base 18 and collector 24. More specifically, the plurality of contacts 28 contact the silicide 23 over the emitter 22, extrinsic base 18 and collector 24.

Figure 2A:
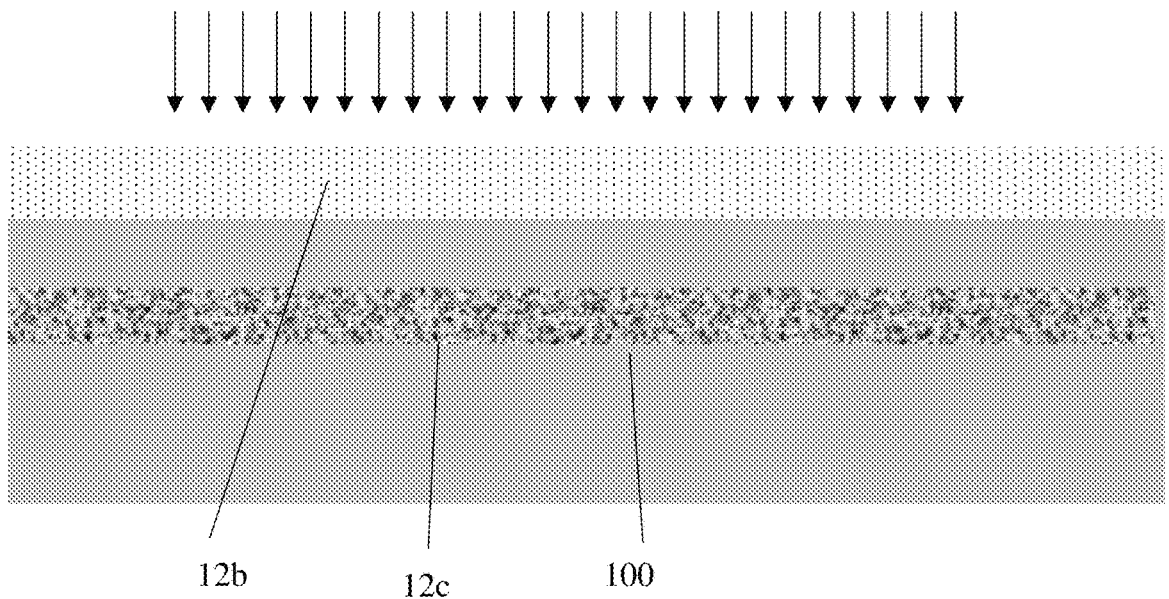
FIGS. 2A-2F show processing steps for fabricating the lateral heterojunction bipolar transistor of FIG. 1 in accordance with aspects of the present disclosure.

FIGS. 2A-2F show processing steps for fabricating the lateral heterojunction bipolar transistor of FIG. 1. In FIG. 2A, a thick oxide layer 12*b* is formed on the semiconductor layer 12*c*. In embodiments, the thick oxide layer 12*b* may be formed by any suitable process, such as separation by implantation of oxygen (SIMOX), oxidation, deposition, and/or other suitable process. Also, as should be understood by those of skill in the art, the thick oxide layer 12*b* may be the buried insulator layer shown in FIG. 1 as will become apparent to those of skill in the art in view of the discussion of FIG. 2C.

Still referring to FIG. 2A, the semiconductor layer 12*c* may be subjected to an ion implantation process (as shown by the arrows) to form a smart cut implant 100 within the semiconductor layer 12*c*. In embodiments, the semiconductor layer 12*c* may be an N+ substrate and the smart cut implant 100 may be a P+ implant, e.g., boron dopant.

Figure 2B:
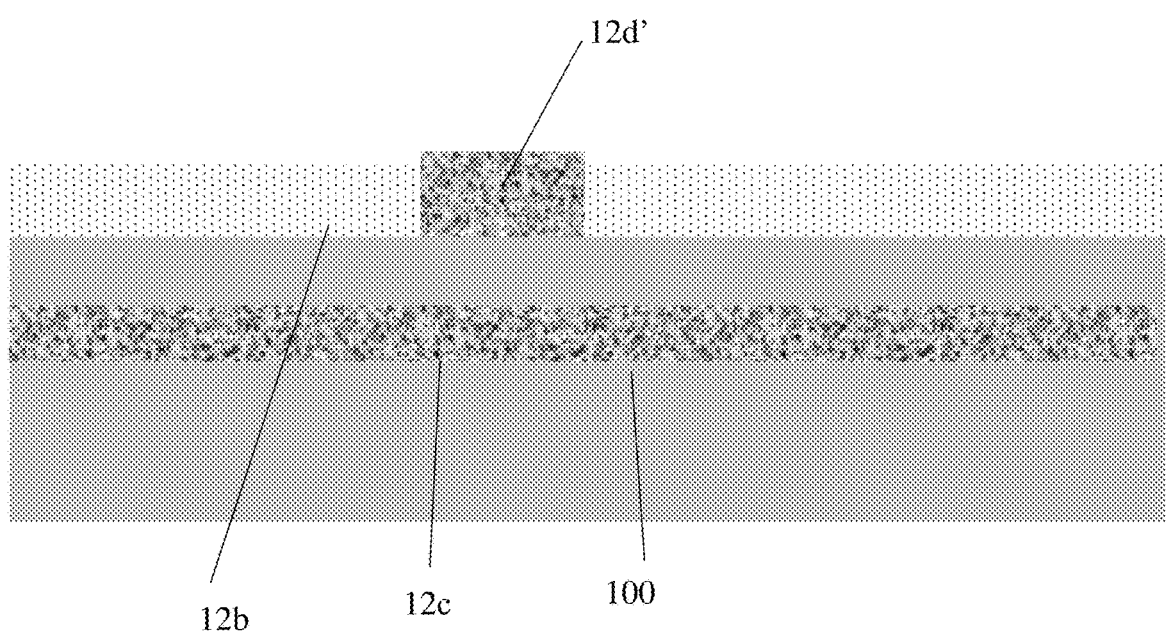

In FIG. 2B, the thick oxide layer 12*b* may be subjected to a patterning process to form the via portion 12*d'*. More specifically, the via portion 12*d'* can be formed by conventional lithography, etching and deposition methods known to those of skill in the art. For example, a resist formed over thick oxide layer 40 is exposed to energy (light) and developed to form a pattern (opening). An etching process with a selective chemistry, e.g., reactive ion etching (RIE), will be used to transfer the pattern from the patterned resist layer to thick oxide layer 12*b* to form a via in the thick oxide layer 12*b*. Following the resist removal by a conventional oxygen ashing process or other known stripants, semiconductor material (e.g., SiC) can be deposited by any conventional deposition processes, e.g., epitaxial growth process or chemical vapor deposition (CVD) processes. Any residual material on the surface of the thick oxide layer 40 can be removed by conventional chemical mechanical polishing (CMP) processes.

Figure 2C:
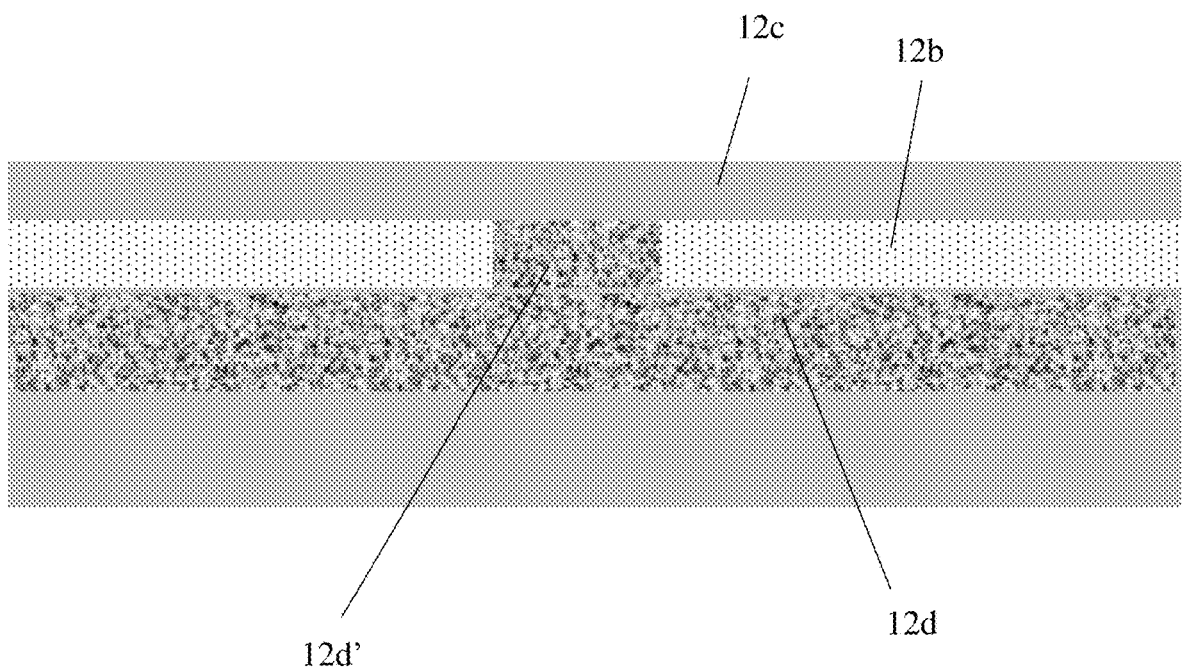

In FIG. 2C, the structure of FIG. 2B is flipped over and the thermal conductive material 12*d* and the handle substrate 12*a* may be bonded to the thick oxide layer 12*b*. In this way, the thick oxide layer 12*b* may become the buried insulator layer. In embodiments, the bonding may be any conventional bonding technique known to those of skill in the art such that no further explanation is required for a complete understanding of the present disclosure. Also, the semiconductor layer 12*c* may be thinned using the smart cut implant 100 as should be understood by those of skill in the art.

Figure 2D:
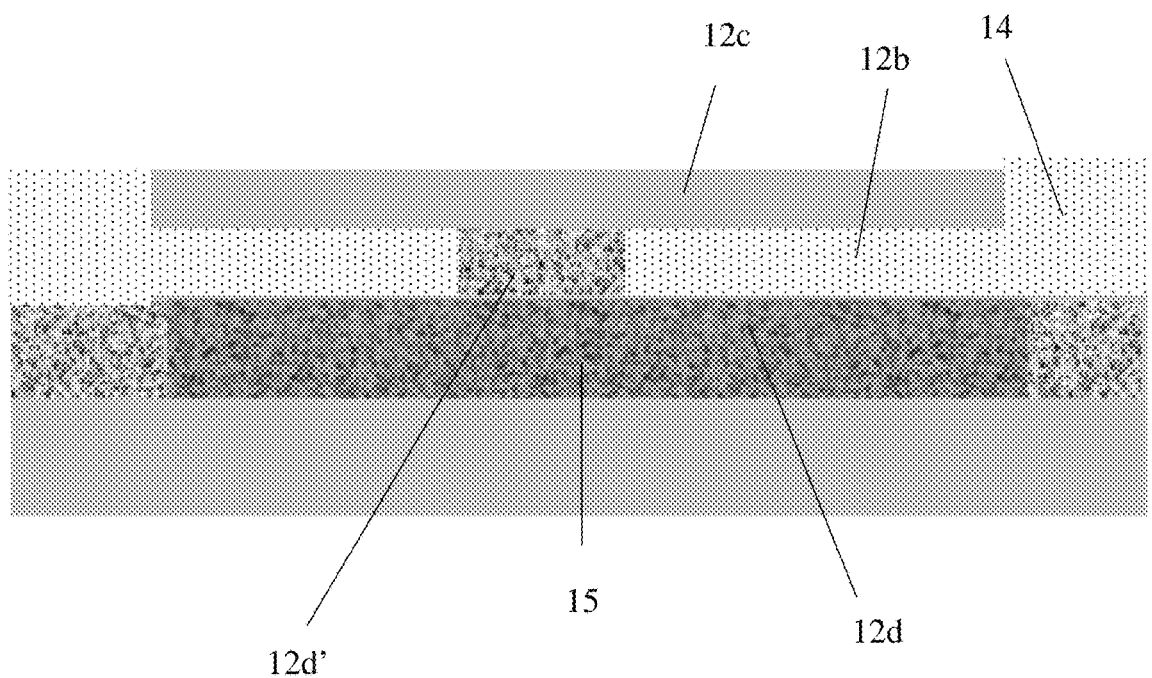

In FIG. 2D, shallow trench isolation structures 14 may be formed through the semiconductor layer 12*c* to the buried insulator layer 12*b*. The shallow trench isolation structures 14 can be formed by conventional lithography, etching and deposition methods known to those of skill in the art as already described herein. The N+ well 15 may be formed in the thermal conductive material 12*d* below the buried insulator layer 12*b*.

The N+ well 15 may be formed by introducing a dopant by, for example, ion implantation in the thermal conductive material 12*d*. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The N+ well 15 is doped with n-type dopants, e.g., Arsenic (As), Phosphorus (P) and Sb, among other suitable examples.

Figure 2E:
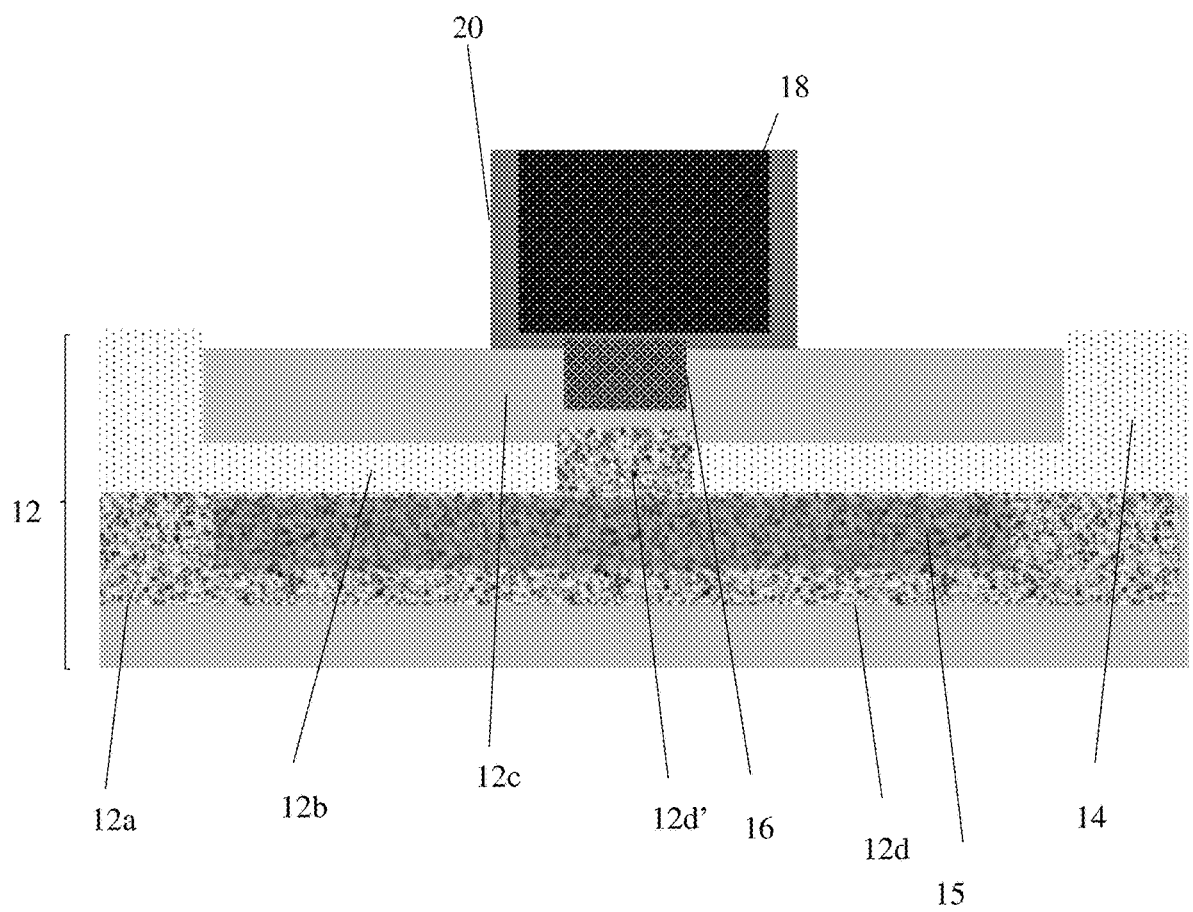

In FIG. 2E, the intrinsic base 16 may be formed by forming a recess in the semiconductor layer 12*c*, followed by an epitaxial growth process. In embodiments, the intrinsic base 16 may be SiGe material. The extrinsic base material 18 may be formed on the intrinsic base material 16. In embodiments, the extrinsic base material 18 may be a semiconductor material (e.g., Si or SiGe) formed by a conventional epitaxial growth process, with an in situ P+ dopant process, e.g., boron. Following the deposition process, the extrinsic base material 18 may be patterned by conventional lithography and etching processes. A spacer material 20 may be formed over the patterned extrinsic base material 18, in addition to an exposed portion of the intrinsic base material 16. In embodiments, the spacer material 20 may be SiN or SiCoN, as examples, deposited by a conventional CVD process followed by an anisotropic etching process.

Figure 2F:
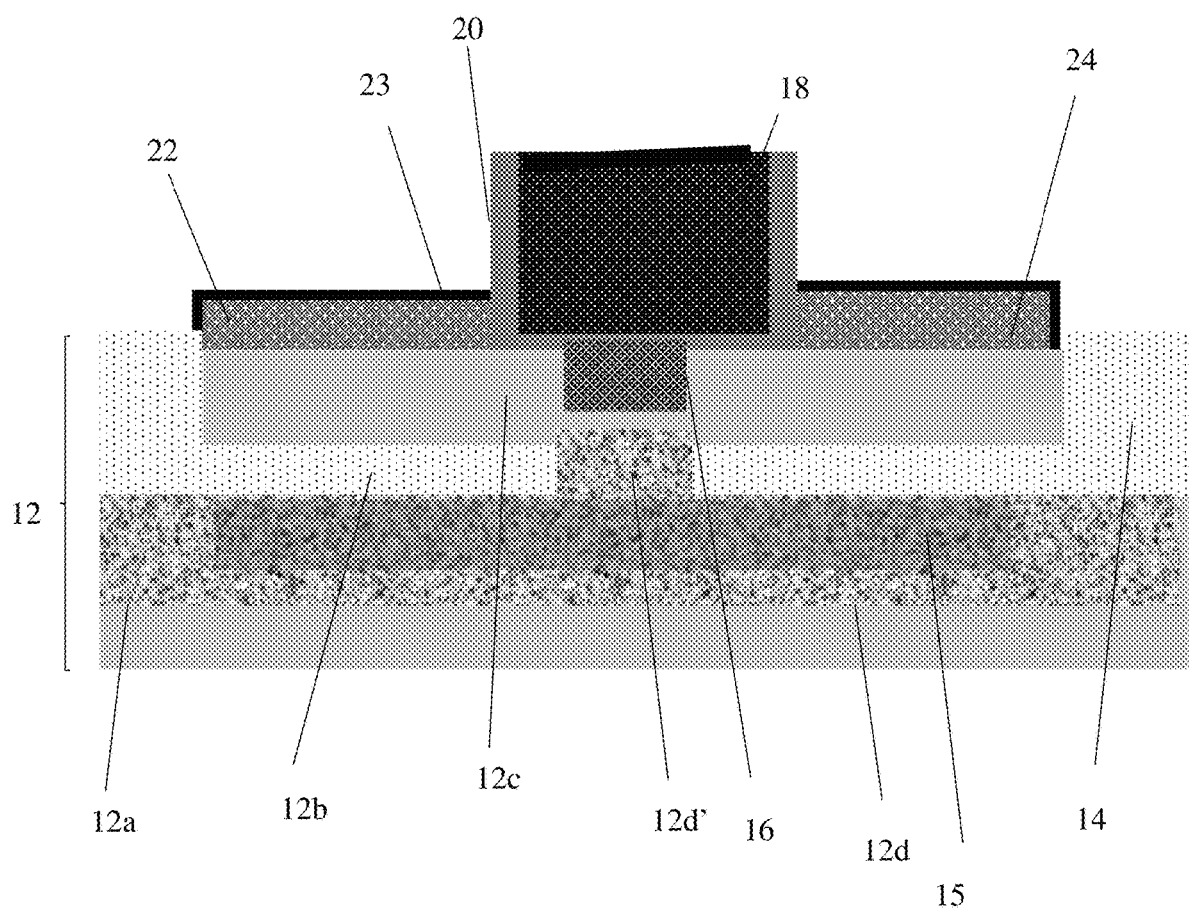

In FIG. 2F, the emitter 22 and collector 24 are formed on the underlying semiconductor layer 12c. In embodiments, the emitter 22 and collector 24 are raised epitaxy regions formed by selectively growing semiconductor material on the semiconductor layer 12c. In embodiments, the epitaxy regions may include epitaxially grown Si material, with an in-situ doping process, e.g., N+ dopant such as arsenic or phosphorous. An annealing process may be performed to drive in the dopant into the emitter 22 and collector 24 (in addition to the P+ dopant of the extrinsic base 18).

A silicide 23 is formed on the emitter 22, collector 24 and the extrinsic base 18. As should be understood by those of skill in the art, the silicide process begins with deposition of a thin transition metal layer, e.g., nickel, cobalt or titanium, over the fully formed and patterned emitter 22, collector 24 and extrinsic base 18. After deposition of the material, the structure is heated allowing the transition metal to react with exposed silicon (or other semiconductor material as described herein) in the active regions of the semiconductor device (e.g., emitter 22, collector 24 and the extrinsic base 18) forming a low-resistance transition metal silicide. Following the reaction, any remaining transition metal is removed by chemical etching, leaving silicide contacts 23.

Referring back to FIG. 1, an interlevel dielectric material 26 may be deposited over the emitter 22, collector 24 and extrinsic base 18. The interlevel dielectric material 26 may be a layered structure of oxide and nitride material. The interlevel dielectric material 26 may be deposited by a conventional deposition method, e.g., CVD.

The interlevel dielectric material 26 undergoes a patterning process, e.g., lithography and etching, to form vias or trenches to the emitter 22, collector 24 and the extrinsic base 18. A conductive material, e.g., tungsten, is deposited within the vias or trenches, making contact to the silicide 23 of the emitter 22, collector 24 and extrinsic base 18. Any residual conductive material may be removed from the interlevel dielectric material 26 by a conventional CMP process. It should be understood by those of ordinary skill in the art that the vias or trenches can be lined with a barrier metal, e.g., TaN, TiN, etc., prior to the deposition of the tungsten material.

The bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a base formed within a semiconductor substrate;
   a thermal conductive material comprising semiconductor material which is under the base and a buried insulator material, and extends to an underlying semiconductor material;
   an emitter on a first side of the base; and
   a collector on a second side of the base,
   wherein the thermal conductive material comprises a material different than the semiconductor substrate and further comprises a via of the thermal conductive material within the buried insulator material underneath the semiconductor substrate, and wherein the via of the thermal conductive material contacts the semiconductor substrate.

2. The structure of claim 1, wherein the thermal conductive material comprises a higher thermal conductivity than the semiconductor substrate.

3. The structure of claim 2, wherein the thermal conductive material comprises SiC and the semiconductor substrate comprises Si.

4. The structure of claim 1, wherein the thermal conductive material is below the buried insulator material and contacts the via of thermal conductive material and a handle substrate.

5. The structure of claim 4, wherein the thermal conductive material comprises P doped material.

6. The structure of claim 4, wherein the thermal conductive material comprises intrinsic material.

7. The structure of claim 4, further comprising an isolation well in the thermal conductive material below the buried insulator material.

8. The structure of claim 4, wherein the thermal conductive material thermally connects the base to the handle substrate.

9. The structure of claim 8, wherein the base comprises an intrinsic base and an extrinsic base vertically above the intrinsic base.

10. A structure comprising:
    a base formed over a semiconductor substrate;
    a buried insulator layer below the semiconductor substrate;
    a handle substrate below the buried insulator layer;

a via comprising a thermal conductive material extending through the buried insulator layer and contacting the semiconductor substrate;

an emitter laterally separated from the base on a first side;

a collector laterally separated from the base on a second side; and an isolation well in the thermal conductive material below the buried insulator material wherein the thermal conductive material further contacts an underside of the buried insulator material and is above a handle substrate.

11. The structure of claim 10, wherein the thermal conductive material comprises a higher thermal conductivity material than the semiconductor substrate.

12. The structure of claim 10, wherein the thermal conductive material comprises SiC and the semiconductor substrate comprises Si.

13. The structure of claim 10, wherein the thermal conductive material provides a thermal conductive pathway between the handle substrate and the semiconductor substrate.

14. The structure of claim 10, wherein the base comprises an intrinsic base within the semiconductor and an extrinsic base vertically above the intrinsic base.

15. The structure of claim 10, wherein the emitter and the collector comprise raised epitaxial semiconductor material which is separated from the base by sidewall spacer material on sidewalls of the base.

16. A method comprises:

forming a base within a semiconductor substrate;

forming a thermal conductive material under the base and extending to an underlying semiconductor material;

forming an emitter on a first side of the base; and forming a collector on a second side of the base, wherein the thermal conductive material comprises a material different than the semiconductor substrate and further comprises a via of the thermal conductive material within a buried insulator material underneath the semiconductor substrate, and wherein the via of the thermal conductive material contacts the semiconductor substrate.

* * * * *